(12) United States Patent
Stamper

(10) Patent No.: US 6,664,581 B2
(45) Date of Patent: Dec. 16, 2003

(54) DAMASCENE CAPACITOR HAVING A RECESSED PLATE

(75) Inventor: Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/382,736

(22) Filed: Mar. 5, 2003

(65) Prior Publication Data

US 2003/0164514 A1 Sep. 4, 2003

Related U.S. Application Data

(62) Division of application No. 09/811,965, filed on Mar. 19, 2001, now Pat. No. 6,576,525.

(51) Int. Cl.[7] .................. H01L 27/108; H01L 29/80; H01L 29/94; H01L 29/76; H01L 31/119
(52) U.S. Cl. .................. 257/301; 257/303; 257/277
(58) Field of Search ................. 257/301, 303, 257/306, 277, 531, 532

(56) References Cited

U.S. PATENT DOCUMENTS

| 4,997,790 | A | | 3/1991 | Woo et al. |
|---|---|---|---|---|
| 5,489,548 | A | | 2/1996 | Nishioka et al. |
| 5,708,559 | A | | 1/1998 | Brabazon et al. |
| 5,879,956 | A | | 3/1999 | Seon et al. |
| 5,886,411 | A | | 3/1999 | Kohyama |
| 5,918,135 | A | | 6/1999 | Lee et al. |
| 5,946,567 | A | | 8/1999 | Weng et al. |
| 5,969,406 | A | | 10/1999 | Bergemont |
| 6,008,083 | A | | 12/1999 | Brabazon et al. |
| 6,025,226 | A | | 2/2000 | Gambino et al. |
| 6,027,966 | A | | 2/2000 | Saenger et al. |
| 6,037,216 | A | | 3/2000 | Liu et al. |
| 6,069,051 | A | | 5/2000 | Nguyen et al. |
| 6,078,492 | A | | 6/2000 | Huang et al. |
| 6,081,021 | A | | 6/2000 | Gambino et al. |
| 6,091,599 | A | | 7/2000 | Amamiya |
| 6,100,138 | A | | 8/2000 | Tu |
| 6,320,244 | B1 | * | 11/2001 | Alers et al. .................. 257/534 |
| 6,344,413 | B1 | * | 2/2002 | Zurcher et al. .............. 438/678 |
| 6,362,012 | B1 | * | 3/2002 | Chi et al. ....................... 438/3 |
| 6,498,364 | B1 | * | 12/2002 | Downey et al. ............. 257/303 |
| 2003/0038903 | A1 | * | 2/2003 | Kobayashi et al. .......... 349/100 |

FOREIGN PATENT DOCUMENTS

| JP | 4316324 | 11/1992 |
|---|---|---|
| WO | WO 99/27581 | 6/1999 |

* cited by examiner

Primary Examiner—Carl Whitehead, Jr.
Assistant Examiner—William Vesperman
(74) Attorney, Agent, or Firm—Schmeiser, Olsen & Watts; William D. Sabo

(57) ABSTRACT

A damascene capacitor structure includes a recessed capacitor plate for preventing leakage and dielectric breakdown between the capacitor plates of the capacitor structure on the surface of the trenches and in the bottom corners of the trenches.

6 Claims, 4 Drawing Sheets

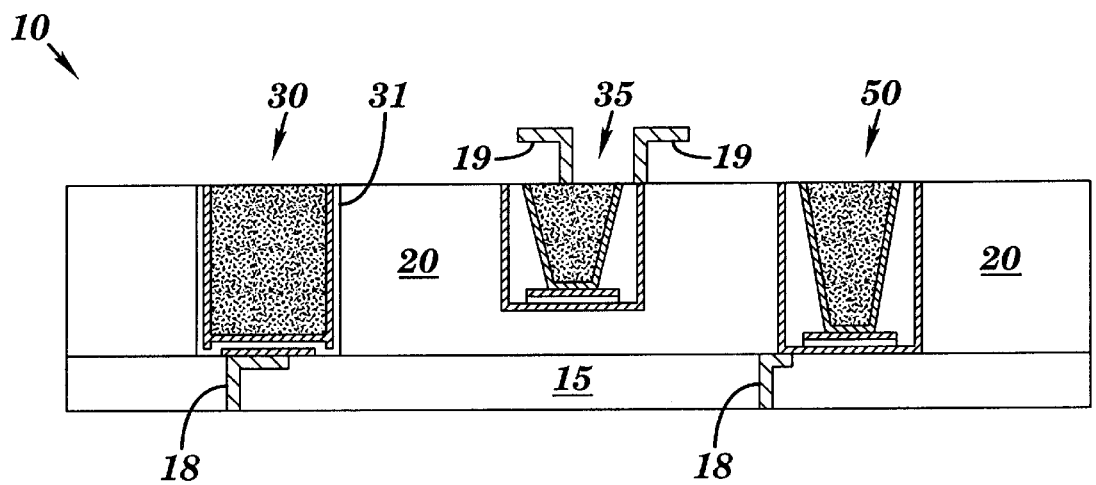
FIG. 1
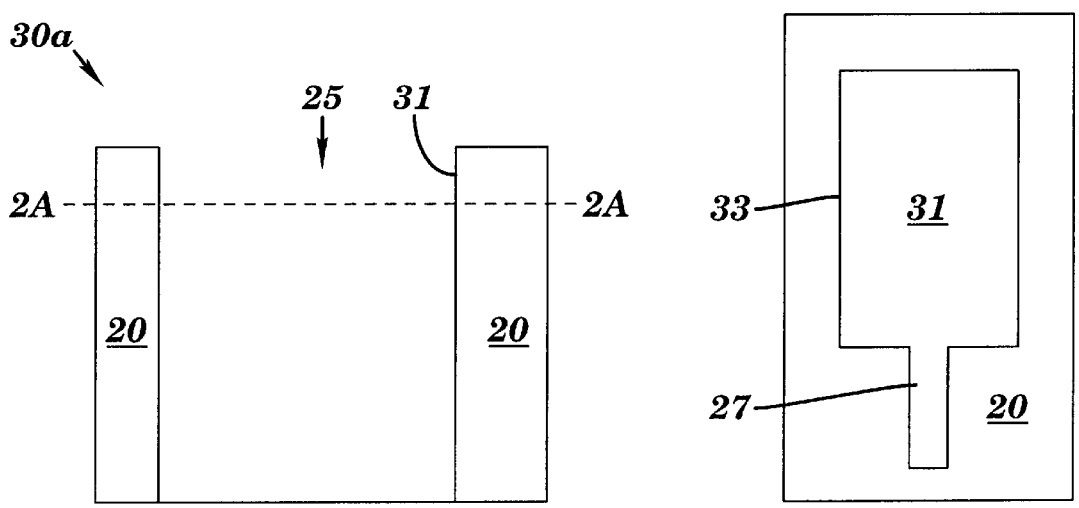
FIG. 2  FIG. 2A

DAMASCENE CAPACITOR HAVING A RECESSED PLATE

This application is a divisional of Ser. No. 09/811,965; filed on Mar. 19, 2001 now U.S. Pat. No. 6,576,525.

BACKGROUND OF THE INVENTION

1. Technical Field

The invention relates generally to capacitors and more specifically to capacitors formed with damascene technology.

2. Related Art

For damascene technology, many integrated circuit components, such as capacitors, are formed in openings or trenches that are etched into an insulator, formed on top of a substrate. A conventional method of manufacturing capacitors is through layering metal-insulator-metal (MIM). Specifically, for a damascene capacitor, the capacitor is formed by first depositing a first metal layer into a trench that was etched into the insulator. A capacitor dielectric layer is then deposited on top of the first metal layer, and then a second layer of metal is deposited over the capacitor dielectric. Thus, the MIM plates will cover the bottom of the trench and extend vertically along the sidewalls of the trench. A chemical mechanical polishing (CMP) process may then be used to planarize the capacitor with the surface of the insulator.

Problems may occur when forming this type of capacitor. Specifically, dielectric breakdown properties of the capacitor dielectric are degraded in some areas, and leakage and dielectric breakdown may occur between the capacitor plates.

Accordingly, a need exists for a damascene capacitor that will prevent leakage and dielectric breakdown between the capacitor plates and provide a more reliable capacitor used in damascene or similar technology.

SUMMARY OF THE INVENTION

The present invention provides a capacitor structure and method for making the capacitor that essentially eliminates leakage and dielectric breakdown between the capacitor plates of the capacitor structure, both on the surface of the trenches and in the bottom corners of the trenches. This is accomplished through the recessed capacitor plate of the present invention.

Generally, the present invention provides a metal-insulator-metal (MIM) capacitor device comprising:
  a trench having sidewalls formed in a layer of interlevel dielectric insulator;
  a first thin lower conductor plate formed in the bottom of said trench;
  a second upper conductor plate coplanar with the surface of the interlevel dielectric insulator; and
  a dielectric layer formed between said first conductor plate and said second conductor plate, said dielectric layer isolating one of said conductor plates from extending to said sidewalls of said trench and isolating at least one upper corner of said one of said conductor plates from extending towards the top of said trench.

In addition, the present invention provides a method of forming an MIM capacitor comprising the steps of:
  a) forming a trench having sidewalls in a layer of interlevel dielectric insulator;
  b) forming a first thin lower conductor plate in the bottom of said trench;
  c) forming a dielectric layer on said lower conductor plate;
  d) forming a second upper conductor plate on said dielectric layer and coplanar with the surface of the interlevel dielectric insulator; and
  e) isolating at least one upper corner of one of said conductor plates from extending to said sidewalls of said trench and extending towards the top of said trench.

The present invention also provides a damascene system having an MIM capacitor device comprising:
  a substrate;
  a layer of interlevel dielectric insulator deposited on said substrate;
  at least one trench having sidewalls formed in said layer of interlevel dielectric insulator;
  a first thin lower conductor plate formed in the bottom of said trench;
  a second upper conductor plate coplanar with the surface of the interlevel dielectric insulator;
  at least one contact for contacting said lower or upper conductor plate; and
  a dielectric layer formed between said first conductor plate and said second conductor plate, said dielectric layer isolating one of said conductor plates from extending to said sidewalls of said trench and isolating at least one upper corner of said one of said conductor plates from extending towards the top of said trench.

The foregoing and other features of the invention will be apparent from the following more particular description of embodiments of the invention, as illustrated in the accompanying drawings.

BRIEF DESCRIPTION OF THE DRAWINGS

Embodiments of the present invention will hereinafter be described in conjunction with the appended drawings, where like designations denote like elements, and wherein:

FIG. 1 is a cross-sectional diagram of three capacitors in accordance with a first and second embodiment of the present invention;

FIGS. 2, 2A, 3, 4, 5 and 6 illustrate one set of steps that may be used to manufacture the capacitor 30 of FIG. 1 in accordance with a first embodiment of the present invention.

DETAILED DESCRIPTION OF THE DRAWINGS

Figure 3:
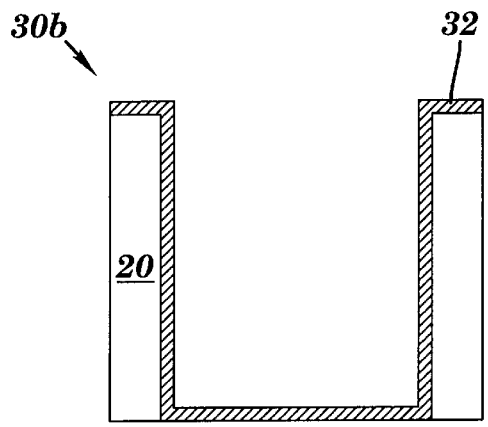

FIG. 1 illustrates a cross-sectional diagram of an apparatus 10 including a substrate 15, an insulator layer 20, a first capacitor 30 in accordance with a first embodiment of the present invention and a second and third capacitor, 50 and 35, respectively, in accordance with a second embodiment of the present invention.

Insulator layer 20, also known as interlevel dielectric insulator, is composed of an insulator material and is formed upon substrate 15. Substrate 15 comprises contacts 18 and 19, such as damascene wiring, and other transistor contacts. Contacts 18 and 19 may be copper wiring, or contacts made of other similar damascene materials, such as polysilicon, tungsten (W), or aluminum/copper (AlCu).

First capacitor 30 is formed within a trench 31 in insulator layer 20. The process of forming first capacitor 30 will be explained in greater detail with reference to FIGS. 2–6. Although trench 31 of first capacitor 30 is approximately the same depth as insulator layer 20 and thus adjoining substrate 15, and connecting with a lower contact 18, trench 31 may be of other depths, such as that of the third capacitor 35. Thus, first capacitor 30 may also be fabricated as a stand-alone structure or processed with other vias and contacts on the same level through dual damascene trenches or other structures.

Second capacitor 50 is similarly formed within a trench in insulator layer 20. The process of forming second capacitor 50 will be explained in greater detail with reference to FIGS. 7–12. As with first capacitor 30, second capacitor 50 is shown adjoining substrate 15 and thus, connecting with lower contact 18, but is not limited to such. Second capacitor 50 may also be fabricated as a stand-alone structure with varying trench depths, as with third capacitor 35, or processed with other vias and contacts on the same level through dual damascene trenches or other structures.

As detailed above, third capacitor 35 is similar in scope to second capacitor 50, except that the depth of third capacitor's trench differs from the depth of second capacitor's trench. This allows for other methods of contact with third capacitor 35 besides through a lower contact. In this example, capacitor 35 connects with upper contacts 19.

As detailed in greater detail below, first capacitor 30 and second capacitor 50 reduce cusping in the bottom corners of the trenches. That is, in related art metal-insulator-metal (MIM) damascene capacitors, the capacitor dielectric thickness in the bottom corners of the trench typically is much less than the thickness in blanket areas, causing cusping in the corners, which results in degraded dielectric breakdown properties. The present invention substantially eliminates this dielectric breakdown. Furthermore, leakage and dielectric breakdown between the capacitor plates on the surface of the trenches after CMP will be eliminated through a recessed capacitor plate of the present invention. That is, in the present invention, upper corners of the recessed capacitor plate do not extend out to the sidewalls or up towards the surface of the trench.

FIGS. 2–6 illustrate the steps for forming first capacitor 30 in accordance with a first embodiment of the present invention. As shown in FIG. 2, the first step 30a in forming first capacitor 30 includes creating 25 a trench 31 in insulator layer 20. Trench 31 may be etched in insulator layer 20 through a standard reactive ion etching (RIE) process. Standard cleans, such as dilute hydroflouric (HF) acid or standard solvents and/or argon-sputter cleaning, could be used if needed to clean RIE residuals.

Although the trench is shown as a single trench and is preferably a single damascene trench, etched in insulator layer 20, trench 31 may also be part of a dual damascene trench with wire or via structures. Furthermore, as illustrated in FIG. 2A, trench 31 may also be formed in a variety of shapes, and is not limited to a three-dimensional rectangular or square shape. The shape of trench 31 is only limited as required by layout restrictions and desired capacitive resistance.

FIG. 2A illustrates an exemplar top-view of trench 31 as viewed along lines 2A of FIG. 2. In this example, trench 31 is a rectangular trench with sidewalls 33 and with finger-extension 27. Thus, for capacitors such as capacitor 35 (see FIG. 1) the lower conductor plate would fill the finger-extension as it extended up towards the top of the trench, allowing for ease of contact with the lower conductor plate. In this example, the width of finger-extension 27 is less than approximately twice the thickness of the lower conductor plate. The depth for the trench in this and other embodiments of the present invention is preferably around 0.5 microns ($\mu$) deep, but is not limited to such. The depth of trench 31 may vary in range anywhere from approximately 0.1 $\mu$ to 5 $\mu$. Likewise, the width (area) of trench 31 may very in range anywhere from approximately 1 micron squared ($\mu^2$) to several thousand microns squared (e.g., the area could be around 1 millimeter squared).

The next step 30b is shown in FIG. 3, wherein a first conductive layer 32 is deposited on the bottom and sides of the trench 31. In this embodiment, first conductive layer 32 comprises a tantalum nitride/tantalum (TaN/Ta) film, deposited through physical vapor deposition (PVD) or ionized physical vapor deposition (IPVD), but is not limited to such. For this specific embodiment, the thickness of first conductive layer 32 is about 50 nanometers (nm), but is not limited to such. The thickness of first conductive layer 32 may vary in range anywhere from approximately 10 nm to 200 nm. First conductive layer 32 may comprise any standard refractory metal liner, deposited using PVD, IPVD, chemical vapor deposition (CVD), or any other method that would be applicable.

Figure 4:
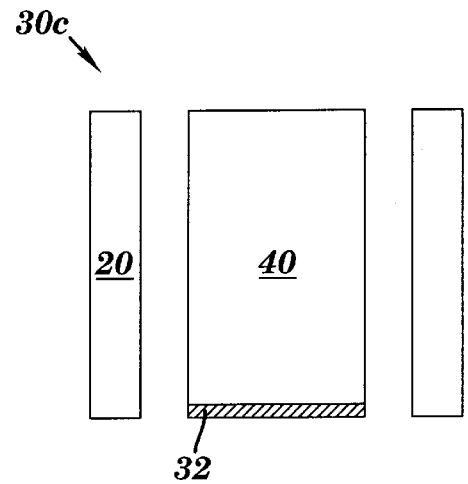

FIG. 4 illustrates the depositioning and lithographic patterning of a photo resist 40 and etching of first conductive layer 32 within the trench 31 (step 30c). An anti-reflective coating (ARC) layer (not shown) may be used under or over the photo-resist. A standard chlorine or sulfur-based (e.g., HCl, $BCl_3$, $SF_6$, $SO_2$, etc.) RIE chemistry may be used to etch first conductive layer 32. Alternatively, if other elements are used, such as tungsten (W) for first conductive layer 32, a standard per-flourocarbon ($PFC-O_2$) chemistry may be used to etch the W. After the first conductive layer 32 is etched and the resist is stripped, a standard post RIE clean may optionally be employed to clean any RIE residuals, such as a mixture of a dilute sulfuric acid and hydrogen-peroxide clean.

Figure 5:
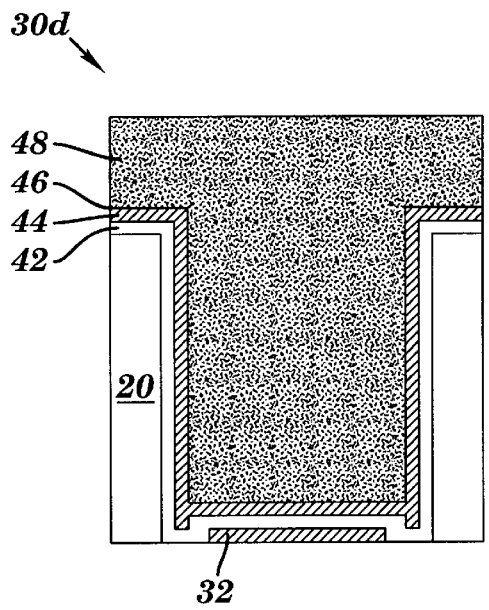

FIG. 5 illustrates step 30d. Step 30d includes depositing a capacitor dielectric 42 in the trench over the remaining first conductive layer 32, depositing a second conductive layer 44 on top of capacitor dielectric 42, depositing an inner conductive layer 46 on top of the second conductive layer 44, and depositing a third conductive layer 48 on inner conductive layer 46. Capacitor dielectric 42 may be made up of one or more layers of silicon dioxide, silicon nitride, $Ta_2O_5$ or any standard capacitor dielectric as known in the art. For this specific embodiment, the thickness of capacitor dielectric 42 is preferably around 100 nm, but is not limited to such. The thickness of capacitor dielectric 42 may vary in range anywhere from approximately 5 nm to 250 nm.

Second conductive layer 44 may comprise any standard refractory metal liner, such as TaN/Ta. As with first conductive layer 32, the thickness of second conductive layer 44 in this embodiment is preferably around 50 nanometers (nm), but is not limited to such. The thickness of second conductive layer 44 may vary in range anywhere from approximately 10 nm to 200 nm.

Inner conductive layer 46 comprises a combination of one or more layers of applicable copper seed or similar seed material, deposited via a PVD, CVD, or similar process, and third conductive layer 48 is preferably electroplated copper, but is not limited to such. After the third conductive layer 48 is deposited, it is essentially not possible to distinguish layer 46 from layer 48. The total thickness of layers 44, 46 and 48 is determined by the remaining depth of trench 31, with the deposited thickness of layers 44, 46, and 48 being approximately equal to the depth of trench 31.

Figure 6:
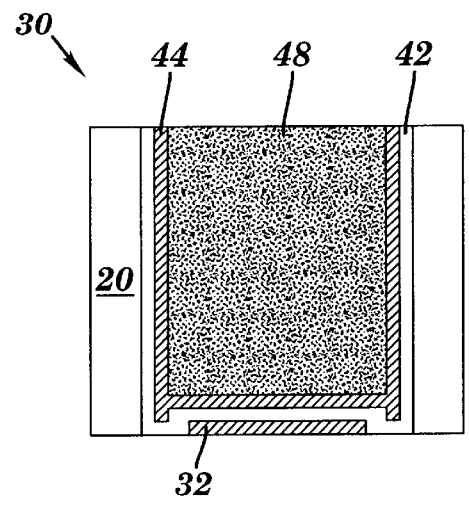

As shown in FIG. 6, the final step includes planarizing layers 42, 44 and 48 and insulator layer 20 through chemical mechanical polishing (CMP) or other appropriate means so that layers 42, 44 and 48 will be coplanar with the surface of insulator layer 20. Although not shown, layers 42, 44 and 48 may also be planarized such that layer 42 is left wholly, or partially, on the surface of insulator layer 20.

Thus, first capacitor 30 includes a first thin lower conductor plate comprising a first conductive layer 32, which is recessed within capacitor dielectric 42. The second, upper conductor plate of the first capacitor 30 is made up of second conductive layer 44, and third conductive layer 48. The first conductor plate is formed in the bottom of the trench and does not extend to the sidewalls of said trench. The upper plate is formed over the capacitor dielectric 42 and substantially fills the trench so as to be coplanar with the surface of the insulator layer.

Figure 7:
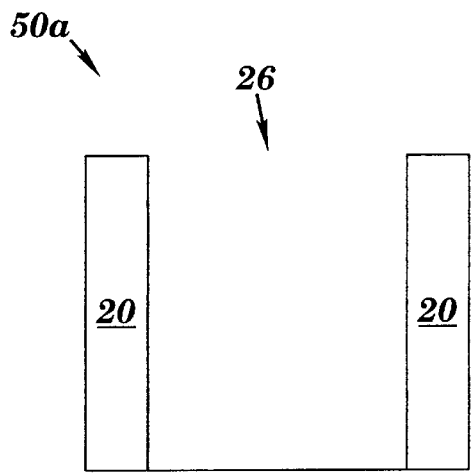
FIGS. 7, 8, 9, 10, 11 and 12 illustrate a second set of steps that may be used to manufacture the capacitors 35 and 50 of FIG. 1 in accordance with a second embodiment of the present invention.

FIGS. 7–12 illustrate the steps for forming second capacitor 50 in accordance with a second embodiment of the present invention. As shown in FIG. 7, the first step 50a in forming second capacitor 50 includes creating a trench 26 in insulator layer 20, which process is similar to that explained in reference to FIG. 2.

Figure 8:
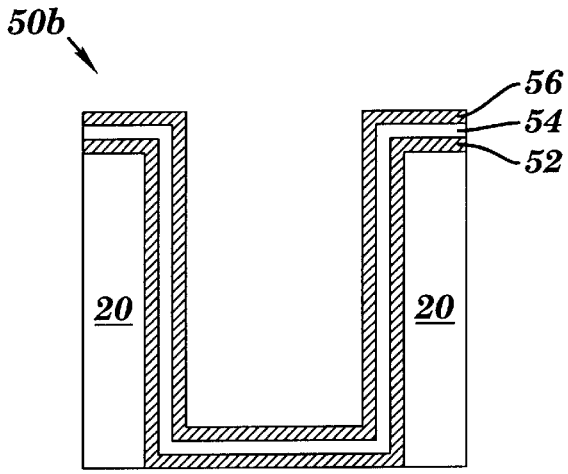

The next step 50b is shown in FIG. 8, wherein a first conductive layer 52, a capacitor dielectric layer 54 and a second conductive layer 56 are deposited in the trench. In this embodiment, first conductive layer 52 and second conductive layer 56 comprise a TaN/Ta film, deposited through PVD or IPVD, but are not limited to such. As with the first embodiment, the thickness of first conductive layer 52 and second conductive layer 56 is about 50 nm and the thickness of capacitor dielectric layer 54 around 100 nm, but the thicknesses of these layers are not limited to such. In this example, the thicknesses of first and second conductive layers 52 and 56 may vary in range anywhere from approximately 10 nm to 200 nm and the thickness of capacitor dielectric 54 may vary in range anywhere from approximately 5 nm to 250 nm.

First and second conductive layers 52 and 56 may comprise a standard refractory metal liner, deposited using PVD, IPVD, CVD, or any other suitable deposition method. Capacitor dielectric layer 54 may be made up of one or more layers of silicon dioxide, silicon nitride, $Ta_2O_5$, or any standard capacitor dielectric as known in the art.

Figure 9:
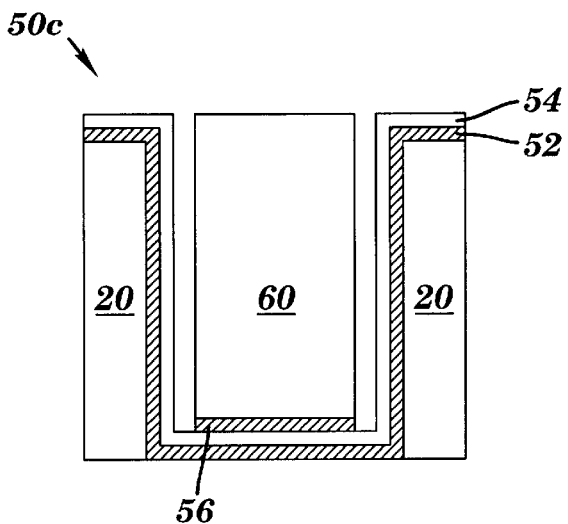

FIG. 9 illustrates the depositioning and lithographic patterning of a photo resist 60 and etching of second conductive layer 56 and capacitor dielectric layer 54 (step 50c). An ARC layer (not shown) may be used under or over the photoresist. A standard chlorine or sulfur-based RIE chemistry may be used to etch second conductive layer 56. After the second conductive layer is etched and the resist is stripped, a standard post RIE clean may optionally be employed to clean any RIE residuals. Upon completion of step 50c, only a portion of the capacitor dielectric layer 54 and the second conductive layer 56 remain on the bottom of the trench.

Figure 10:
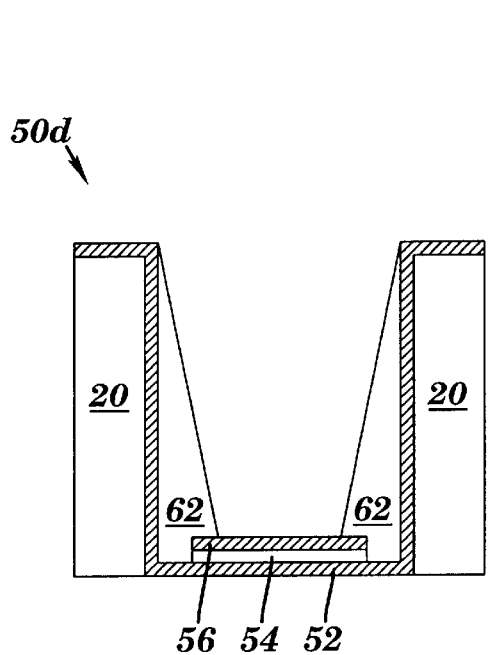

The next step, step 50d, is illustrated in FIG. 10. After the second conductive layer 56 and capacitor dielectric 54 are patterned, sidewall spacers 62 are formed in the trench. One method of forming sidewall spacers 62, as known in the art, comprises depositing a layer of plasma enhanced chemical vapor deposition (PECVD) or HDPCVD silicon nitride on the wafer and performing an anisotropic spacer etchback to leave silicon nitride on the trench sidewalls but not on the top of the trench, which is the interlevel 20 surface. Thus, the sidewall spacers 62 are thicker at the bottom of the trench than at the top of the trench. If other damascene or similar wiring levels need to be fabricated coplanar with second capacitor 50, they may be patterned and etched during this step.

Figure 11:
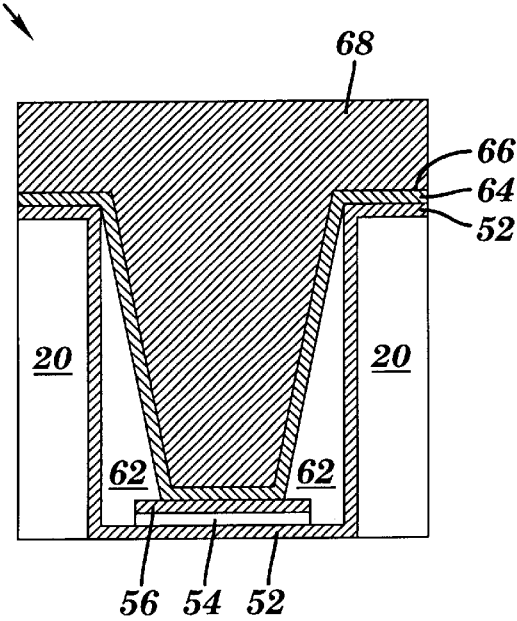

FIG. 11 illustrates the next step, step 50e, in forming second capacitor 50. A middle conductive layer 64, an inner conductive layer 66, and a third conductive layer 68 are deposited on the sidewall spacers 62. Middle conductive layer 64 comprises TaN/Ta, or similar material, inner conductive layer 66 comprises one or more combined layers of copper seed or other applicable seed material, deposited via PVD, CVD, or similar process, and third conductive layer 68 is preferably electroplated copper, but is not limited to such. As with the first embodiment of the present invention, after the third conductive layer 68 is deposited, it is essentially not possible to distinguish layers 66 from 68. Also, the thickness of layers 64, 66 and 68 is determined by the remaining depth of the trench, with the deposited thickness of layers 64, 66, and 68 being approximately equal to the trench depth.

Figure 12:
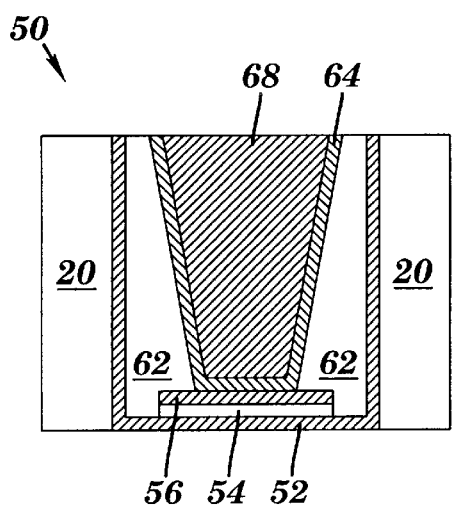

As shown in FIG. 12, layers 52, 64 and 68 and isolated layer 20 are then planarized through chemical mechanical polishing (CMP) or other appropriate means. Thus, second capacitor 50 includes a first thin lower conductor plate comprising first conductive layer 52, which extends to the sidewall of the trench. Capacitor dielectric 54 is located between the first conductor plate and the second conductor plate. The second, upper conductor plate of second capacitor 50 is made up of second conductive layer 56, middle conductive layer 64, and third conductive layer 68. The first conductor plate is formed in the bottom of the trench and the upper conductor plate is formed over the capacitor dielectric 54 with sidewall spacers 62 overlapping the ends of the second conductive layer and isolating the upper corners of the second conductive layer 56 of the upper conductor plate from extending towards the top of the trench. After CMP, sidewall spacers 62 provide enough isolation between the first and second conductor plates to prevent leakage and dielectric breakdown.

Thus, this invention provides a capacitor which includes a recessed capacitor plate for preventing leakage and dielectric breakdown between the capacitor plates of the capacitor structure on the surface of the trenches and in the bottom corners of the trenches.

While the invention has been particularly shown and described with reference to a specific embodiment thereof, it will be understood by those skilled in the art that the foregoing and other changes in form and details may be made therein without departing from the spirit and scope of the invention.

What is claimed is:

1. A metal-insulator-metal (MIM) capacitor device comprising:
    a trench having sidewalls formed in a layer of interlevel dielectric insulator;
    a first thin lower conductor plate formed in the bottom of said trench;
    a second upper conductor plate coplanar with the surface of the interlevel dielectric insulator; and
    a continuous dielectric layer including a continuously distributed dielectric material, said dielectric layer formed between said first conductor plate and said second conductor plate, said dielectric layer isolating one of said conductor plates from extending to said sidewalls of said trench and isolating at least one upper corner of said one of said conductor plates from extending to the top of said trench, wherein said dielectric layer isolates said lower conductor plate from extending to said sidewalls of said trench, and wherein said dielectric layer is in direct mechanical contact with said sidewalls.

2. The device of claim 1, wherein said lower conductor plate comprises:

a layer of at least one refactory metal.

3. The device claim 1, wherein said upper conductor plate comprises:

a layer of at least one refractory metal; and a layer or copper.

4. A damascene system having an MIM capacitor device comprising: a substrate;

a layer of interlevel dieletric insulator deposited on said substrate;

at least one trench having sidewalls formed in said layer of interlevel dielectric insulator;

a first thin lower conductor plate formed in the bottom of said trench;

a second upper conductor plate coplanar with the surface of the interlevel dielectric insulator;

at least one contact for contacting said lower or upper conductor plate; and a continuous dielectric layer including a continuously distributed dielectric material, said dielectric layer formed between said first conductor plate and said second conductor plate, said dielectric layer isolating one of said conductor plates from extending to said sidewalls of said trench and isolating at least one upper corner of said one of said conductor plates from extending to the top of said trench, wherein said dielectric layer isolates said lower conductor plate from extending to said sidewalls or said trench, and wherein said dielectric layer is in direct mechanical contact with said sidewalls.

5. The device of claim 4, wherein said lower conductor plate comprises:

a layer of at least one refractory metal.

6. The device of claim 4, wherein said upper conductor plate comprises:

a layer of at least one refractory metal; and a layer of copper.

* * * * *